United States Patent
Huo et al.

(10) Patent No.: US 10,508,346 B2
(45) Date of Patent: Dec. 17, 2019

(54) PATTERN OF A FILM LAYER INCLUDING ALUMINUM, AND MANUFACTURING METHOD AND AFTERTREATMENT METHOD THEREOF

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Xiaodi Huo, Beijing (CN); Guote Wu, Beijing (CN); Soondong Lee, Beijing (CN); Jihoon Lee, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 2 days.

(21) Appl. No.: 15/752,242

(22) PCT Filed: Aug. 10, 2017

(86) PCT No.: PCT/CN2017/096832
§ 371 (c)(1),
(2) Date: Feb. 12, 2018

(87) PCT Pub. No.: WO2018/036387
PCT Pub. Date: Mar. 1, 2018

(65) Prior Publication Data
US 2019/0062925 A1    Feb. 28, 2019

(30) Foreign Application Priority Data
Aug. 24, 2016  (CN) .......................... 2016 1 0720311

(51) Int. Cl.
*C23F 4/00*    (2006.01)
*H01L 21/3213*  (2006.01)

(52) U.S. Cl.
CPC .......... *C23F 4/00* (2013.01); *H01L 21/32138* (2013.01); *H01L 21/32139* (2013.01)

(58) Field of Classification Search
None
See application file for complete search history.

(56) References Cited

U.S. PATENT DOCUMENTS 5,681,424 A    10/1997 Saito et al.
2016/0196985 A1  7/2016 Tan et al.

FOREIGN PATENT DOCUMENTS

CN    101752207 A    6/2010
CN    102956430      3/2013
(Continued)

OTHER PUBLICATIONS

State Intellectual Property Office of People's Republic of China, "First Office Action," issued in connection with Chinese Patent Application No. 201610720311.4, dated May 28, 2018, 16 pages.

(Continued)

*Primary Examiner* — Allan W. Olsen
(74) *Attorney, Agent, or Firm* — Arent Fox LLP; Michael Fainberg

(57) ABSTRACT

Disclosed is a pattern of a film layer including aluminum, and a manufacturing method and an aftertreatment method thereof. In the manufacturing method, a patterned photoresist layer (320) which covers on a to-be-patterned film layer (310) including aluminum is taken as a mask, and a dry etching process is performed on the to-be-patterned film layer (310) by using a gas including $Cl_2$ to form a patterned film layer; and then the formed patterned film layer (310) including aluminum is subjected to dechlorination treatment (Continued)

Performing dechlorination treatment and uninstalling of a bearing substrate on a patterned film layer including aluminum simultaneously, where the patterned film layer is formed by a dry etching process using a gas including $Cl_2$ — S101 and uninstalling of a bearing substrate (200) simultaneously. The method can improve the productivity and save the cost.

10 Claims, 1 Drawing Sheet

(56) References Cited

FOREIGN PATENT DOCUMENTS

| CN | 103545163 A | 1/2014 |
|---|---|---|
| CN | 104716072 A | 6/2015 |
| CN | 104916534 A | 9/2015 |
| CN | 106206290 A | 12/2016 |
| JP | 08148466 A | 6/1996 |
| JP | 8172076 | 7/1996 |
| TW | 392244 | 6/2000 |

OTHER PUBLICATIONS

International Search Report for International Application No. PCT/2017/096832, dated Nov. 10, 2017.

Performing dechlorination treatment and uninstalling of a bearing substrate on a patterned film layer including aluminum simultaneously, where the patterned film layer is formed by a dry etching process using a gas including Cl₂ — S101

Fig.1

Taking a patterned photoresist layer which covers on a to-be-patterned film layer including aluminum as a mask, and performing a dry etching process on the to-be-patterned film layer by using a gas including Cl₂ to form a patterned film layer — S201

Performing the above aftertreatment method according to an embodiment of the present invention on the patterned film layer — S202

Fig.2

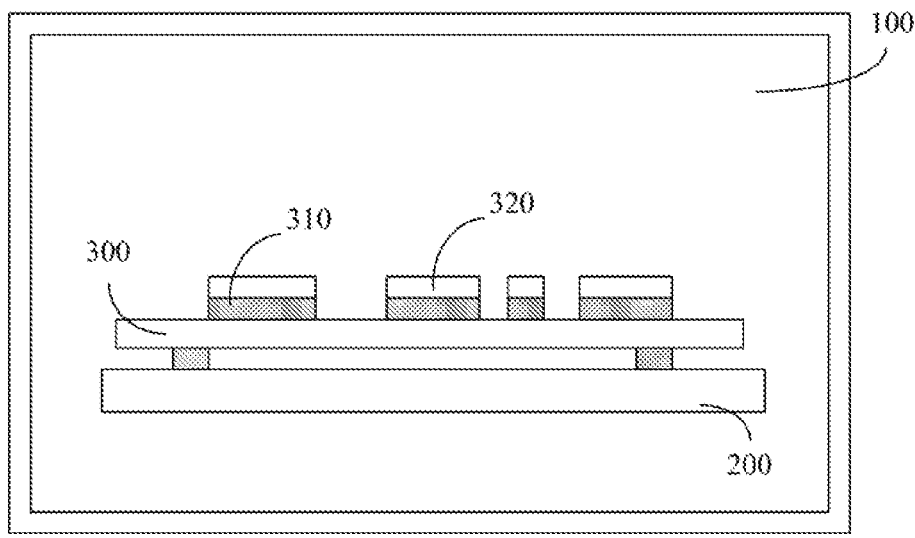

Fig.3

PATTERN OF A FILM LAYER INCLUDING ALUMINUM, AND MANUFACTURING METHOD AND AFTERTREATMENT METHOD THEREOF

CROSS-REFERENCE TO RELATED APPLICATIONS

This application is a National Stage of International Application No. PCT/CN2017/096832, filed Aug. 10, 2017, which claims priority to Chinese Patent Application No. 201610720311.4, filed Aug. 24, 2016, both of which are hereby incorporated by reference in their entireties.

FIELD

The embodiments of the present invention provide a pattern of a film layer including aluminum, and a manufacturing method and an aftertreatment method thereof.

BACKGROUND

At present, components inside a display substrate include multiple film layers with patterns, and some patterned film layers need to be formed by a dry etching process. For example, when forming a pattern of a data line, a titanium/aluminum/titanium (Ti/Al/Ti) composite film layer needs to be subjected to dry etching by using the gas including chlorine ($Cl_2$). The residual $Cl_2$ and a surface of the patterned film layer may react with the moisture in the atmosphere, thereby leading to corrosion of the patterned film layer. Therefore, an aftertreatment process (AT process) of dechlorination is generally performed after the above dry etching process, and then the patterned film layer is discharged from the bearing glass substrate.

SUMMARY

The embodiments of the present invention provide an aftertreatment method for a dry etching process of a pattern of a film layer including aluminum, including: performing dechlorination treatment and uninstalling of a bearing substrate on a patterned film layer including aluminum simultaneously, wherein the patterned film layer is formed by a dry etching process using a gas including $Cl_2$.

For example, in the above aftertreatment method according to an embodiment of the present invention, the performing the dechlorination treatment can include: introducing a gas mixture including $O_2$ and $CF_4$ for the dechlorination treatment.

For example, in the above aftertreatment method according to an embodiment of the present invention, in the introduced gas mixture including $O_2$ and $CF_4$, the gas volume flow ratio of $O_2$ and $CF_4$ ranges from 10:1 to 50:1.

For example, in the above aftertreatment method according to an embodiment of the present invention, in the introduced gas mixture including $O_2$ and $CF_4$, the gas volume flow of $O_2$ is 1500 sccm, and the gas volume flow of $CF_4$ is 50 sccm.

For example, in the above aftertreatment method according to an embodiment of the present invention, the uninstalling of the bearing substrate includes: removing the static electricity which adsorbs the bearing substrate.

For example, in the above aftertreatment method according to an embodiment of the present invention, the removing the static electricity which adsorbs the bearing substrate can include: loading a voltage of 6 kV to 15 kV to generate plasma so as to remove the static electricity.

For example, in the above aftertreatment method according to an embodiment of the present invention, the duration of simultaneously performing the dechlorination treatment and the uninstalling of the bearing substrate ranges from 20 s to 50 s.

For example, in the above aftertreatment method according to an embodiment of the present invention, the cavity pressure for simultaneously performing the dechlorination treatment and the uninstalling of the bearing substrate ranges from 30 to 100 millitorrs.

The embodiment of the present invention further provides a manufacturing method of a pattern of a film layer including aluminum, including: taking a patterned photoresist layer which covers on a to-be-patterned film layer including aluminum as a mask, and performing a dry etching process on the to-be-patterned film layer by using a gas including Cl2 to form a patterned film layer; and performing the above aftertreatment method according to an embodiment of the present invention on the patterned film layer.

For example, in the above manufacturing method according to an embodiment of the present invention, the to-be-patterned film layer is a data signal line layer or a touch electrode line layer.

For example, in the above manufacturing method according to an embodiment of the present invention, the to-be-patterned film layer is a Ti/Al/Ti composite film layer, a Mo/Al/Mo composite film layer or a Ti/Al/Mo composite film layer.

The embodiment of the present invention further provides a pattern of a film layer including aluminum, wherein the pattern of the film layer including aluminum is manufactured by the above manufacturing method according to an embodiment of the present invention.

BRIEF DESCRIPTION OF THE DRAWINGS

In order to more clearly illustrate the technical solutions of the embodiments of the present invention, a brief introduction will be given below on the accompanying drawings of the embodiments. Apparently, the accompanying drawings described below merely involve some embodiments of the present invention, rather than limiting the present invention.

FIG. 1 is a flow chart of an aftertreatment method according to an embodiment of the present invention;

FIG. 2 is a flow chart of a manufacturing method of a pattern of a film layer including aluminum according to an embodiment of the present invention;

FIG. 3 is a schematic diagram of the manufacturing method of the pattern of the film layer including aluminum according to an embodiment of the present invention.

DETAILED DESCRIPTION OF THE EMBODIMENTS

In order to make the objectives, technical solutions, and advantages of the embodiments of the present invention more apparent, a clear and complete description will be given below on the technical solutions of the embodiments in the present invention in combination with the accompanying drawings of the embodiments of the present invention, and apparently the embodiments described below are only a part but not all of the embodiments of the present invention. Based upon the described embodiments of the present invention, all the other embodiments which can occur to those skilled in the art without any inventive effort shall all fall into the protection scope of the present invention.

After a pattern of a data line is formed by the dry etching process, two process steps are further required, and each process step needs for about 30 s. Furthermore, since the two process steps require different process parameters, e.g., different cavity pressures are required, therefore, there is an intermediate device waiting time between the two process steps, and the waiting time is about 10 s. Thus a total of about 70 s is required, leading to greatly prolonged process time.

In addition, the gas used in the aftertreatment process of dechlorination may have an effect of ashing the patterned photoresist layer which serves as a mask on the patterned film layer, thereby leading to the increase of the damage to the photoresist layer and the increase of attachments inside the cavity of the device. The suspended particles in the cavity may increase the possibility of generating undesirable residues of patterned film layer in the subsequent dry etching process of the substrate, and shorten the period of daily maintenance of the device.

A brief description will be given below on the specific implementations of the pattern of the film layer including aluminum, the manufacturing method and the aftertreatment method thereof according to embodiments of the present invention below with reference to the accompanying drawings.

As described above, since the gas including chlorine ($Cl_2$) is used in the dry etching process, therefore, after the dry etching process and before removing the patterned photoresist on the patterned film layer, residual $Cl_2$ may exist on the surface of the patterned film layer including aluminum (Al), and the metallic aluminum in the patterned film layer may adsorb the residual $Cl_2$ and perform the following reaction: $2Al+3Cl_2 \rightarrow 2AlCl_3 \uparrow$.

Therefore, if no dechlorination treatment is performed, then when the patterned film layer is exposed in the air, $AlCl_3$ generated from the reaction between the residual $Cl_2$ and the metallic aluminum in the patterned film layer may react with the moisture in the atmosphere to generate HCl. HCl may react with Al to generate $Al_xCl_y$. $Al_xCl_y$ then reacts with the moisture in the atmosphere with the reaction equation as follows: $Al_xCl_y+H_2O \rightarrow Al(OH)_3+HCl$. The patterned film layer is corroded continuously, which finally leads to broken lines due to the undesirable corrosion of the patterned film layer.

The embodiment of the present invention provides an aftertreatment method for a dry etching process of a pattern of a film layer including aluminum, and as shown in FIG. 1, the method includes the following steps.

S101, performing dechlorination treatment and uninstalling of a bearing substrate on a patterned film layer including aluminum simultaneously, where the patterned film layer is formed by a dry etching process using a gas including $Cl_2$.

In the above aftertreatment method according to an embodiment of the present invention, the dechlorination treatment and the uninstalling of a substrate are performed simultaneously, thereby saving the waiting time of the intermediate device, shortening the processing duration of the whole aftertreatment process, and improving the productivity. Furthermore, the amount of the gas used during the dechlorination treatment and the uninstalling of a substrate can also be reduced, and the cost is saved. In addition, the amount of the gas used in the aftertreatment process is reduced, thereby reducing the damage to the patterned photoresist layer, decreasing the suspended particles generated by the attachments inside the cavity of the device, lowering the possibility of generating undesirable residues in the subsequent dry etching process of the substrate, and prolonging the period of daily maintenance of the device.

In the above aftertreatment method according to an embodiment of the present invention, the dechlorination treatment can for example be performed as follows: introducing a gas mixture including oxygen ($O_2$) and carbon tetrafluoride ($CF_4$) into the cavity of the device for dechlorination treatment, with the reaction equation being as follows:

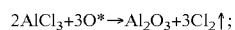

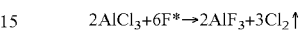

Since the $CF_4$ used in the dechlorination treatment may have an effect of asking the patterned photoresist layer which serves as a mask on the patterned film layer, and damaging the photoresist layer, therefore, in the above aftertreatment method according to an embodiment of the present invention, the proportion of $CF_4$ in the introduced gas mixture of $O_2$ and $CF_4$ is defined, and the proportion of $CF_4$ can be lowered.

In the above aftertreatment method according to an embodiment of the present invention, in the introduced gas mixture including $O_2$ and $CF_4$, the gas volume flow ratio of $O_2$ and $CF_4$ ranges from 10:1 to 50:1. For example, the gas volume flow ratio of $O_2$ and $CF_4$ is preferably 30:1.

In the above aftertreatment method according to an embodiment of the present invention, in the introduced gas mixture including $O_2$ and $CF_4$ in the reaction cavity, for example, the gas volume flow of $O_2$ is 1500 sccm and the gas volume flow of $CF_4$ is 50 sccm preferably. Compared with the aftertreatment process of dechlorination in which the gas volume flow of $O_2$ is 2000 sccm and the gas volume flow of $CF_4$ is 200 sccm, the above aftertreatment method according to an embodiment of the present invention greatly reduces the use amount of $CF_4$, thereby reducing the damage to the photoresist layer, and further reducing the suspended particles generated by the attachments inside the cavity of the device, lowering the possibility of generating undesirable residues in the subsequent dry etching process of the substrate, and prolonging the period of daily maintenance of the device.

In the above aftertreatment method according to an embodiment of the present invention, since in the dry etching process, a vacuum or electrostatic adsorption manner can be adopted to adsorb a substrate formed with a patterned film layer on the bearing substrate, therefore, for the electrostatic adsorption manner, when uninstalling the bearing substrate, the manner of removing the static electricity which adsorbs the bearing substrate can be adopted.

For example, in the above aftertreatment method according to an embodiment of the present invention, when removing the static electricity which adsorbs the bearing substrate, a voltage of 6 kV to 1.5 kV is usually loaded to generate plasma to remove the static electricity. For example, the loaded voltage is generally controlled to be about 8 kV preferably.

In the above aftertreatment method according to an embodiment of the present invention, the duration of simultaneously performing dechlorination treatment and uninstalling of a bearing substrate can be controlled to be 20 s to 50 s. For example, the duration is controlled to be about 40 s. Compared with the processing duration of 70 s after the dry etching process, the aftertreatment method according to an embodiment of the present invention can save the processing duration by nearly a half, thereby greatly improving the productivity.

In the above aftertreatment method according to an embodiment of the present invention, the cavity pressure for simultaneously performing dechlorination treatment and uninstalling of a bearing substrate is controlled to be 30 to 100 millitorrs. For example, the cavity pressure is controlled to be about 50 millitorrs. The cavity pressure within such a range can realize the processes of dechlorination treatment and removal of the static electricity at the same time in the cavity.

The embodiment of the present invention further provides a manufacturing method of a pattern of a film layer including aluminum, since the principle of solving problems of the present manufacturing method is similar to that of the above aftertreatment method, therefore, the implementation of the present manufacturing method can be referred to the implementation of the aftertreatment method and the repetitions will not be repeated redundantly.

The manufacturing method of the pattern of the film layer including aluminum according to an embodiment of the present invention includes the following steps S201 to S202 as shown in FIG. 2.

S201, taking a patterned photoresist layer which covers on a to-be-patterned film layer including aluminum as a mask, and performing a dry etching process on the to-be-patterned film layer by using a gas including $Cl_2$ to form a patterned film layer.

For example, the gas mixture of $Cl_2$ and boron trichloride ($BCl_3$) can be used for the dry etching process.

S202, performing the above aftertreatment method according to an embodiment of the present invention on the patterned film layer.

Before performing the dry etching process to form the patterned film layer, the above step S201 can further include the following steps.

Firstly, coating photoresist on the to-be-patterned film layer including aluminum; and then providing a pattern of a mask to expose and develop the photoresist, and forming the patterned photoresist layer on the to-be-patterned film layer. The pattern of the patterned photoresist layer can be consistent with the final pattern of the patterned film layer.

The above manufacturing method according to an embodiment of the present invention can be used in the manufacturing processes of different products, for example, can be used for the manufacturing of an array substrate of devices such as a Thin Film Transistor-Liquid Crystal Display (TFT-LCD) device, an Organic Light-Emitting Diode (OLED) and an electronic paper display device. The array substrate can include a transistor (such as a thin film transistor) used as a switch or a drive element, a scanning signal line (a gate line), a data signal line (a data line), a power line and the like. Furthermore, the transistor further includes a thin film gate, a source and a drain, and these signal lines or electrodes can be manufactured by using the conductive thin film including aluminum. The above manufacturing method according to an embodiment of the present invention can be further used for the manufacturing of a touch panel. The touch panel can include a touch electrode, a touch electrode line and the like, and these signal lines or electrodes can be manufactured by using the conductive thin film including aluminum. For example, in the above manufacturing method according to an embodiment of the present invention, the to-be-patterned film layer can be a scanning signal line layer, a data signal line layer or a touch electrode line layer, etc.

In the above manufacturing method according to an embodiment of the present invention, the to-be-patterned film layer can be specifically a titanium/aluminum/titanium (Ti/Al/Ti) composite film layer, a molybdenum/aluminum/molybdenum (Mo/Al/Mo) composite film layer or a titanium/aluminum/molybdenum (Ti/Al/Mo) composite film layer, however, the embodiment of the present invention is not limited herein.

As shown in FIG. 3, the reaction cavity 100 is for example used for the patterning process, a treated substrate 300 is adsorbed on the bearing substrate 200, and the treated substrate 300 is formed with a patterned film layer 310 and a photoresist layer 320 arranged above the patterned film layer 310 for the patterning process. The treated substrate 300 can be an array substrate or a touch panel for example, the patterned film layer 310 is obtained from the above to-be-patterned film layer including aluminum by the dry etching process using the gas including $Cl_2$, while the photoresist layer 320 is used for the etching mask of the patterned film layer 310.

Taking the to-be-patterned film layer being a Ti/Al/Ti composite film layer as an example, a specific introduction will be given on the principle of the dry etching process in the above manufacturing method according to an embodiment of the present invention.

For the Ti/Al/Ti composite film layer, the strong oxidizing property of chlorine atoms is mainly utilized in the dry etching process, where chlorine atoms react with metal to generate volatile substances with the reaction equation as follows: $Ti, Al+Cl \rightarrow TiCl_4\downarrow + AlCl_3\uparrow$. However, since there is an oxide layer on the metal Ti, complete etching cannot be realized by only using $Cl_2$, therefore, $BCl_3$ should be used to remove the oxide layer, and simultaneously $BCl_3$ should be utilized to protect the side face of Ti, and prevent serious etching of the side face. Therefore, the gas mixture of $Cl_2$ and $BCl_3$ is usually used to serve as the etching gas of the dry etching process.

The embodiment of the present invention further provides a pattern of a film layer including aluminum, and the pattern is specifically manufactured by the above manufacturing method of the pattern of the film layer including aluminum according to an embodiment of the present invention.

In the above pattern of a film layer including aluminum and the manufacturing method and aftertreatment method thereof according to an embodiments of the present invention, a patterned photoresist layer which covers on the to-be-patterned film layer including aluminum is taken as a mask, and a dry etching process is performed on the to-be-patterned film layer by using a gas including $Cl_2$ to form a patterned film layer; and then the formed patterned film layer including aluminum is subjected to dechlorination treatment and uninstalling of the bearing substrate simultaneously. The dechlorination treatment and the uninstalling of a substrate are performed simultaneously, thereby saving the waiting time of the intermediate devices, shortening the processing duration of the whole aftertreatment process, and improving the productivity. Furthermore, the amount of the gas used during the dechlorination treatment and the uninstalling of a substrate can also be reduced, and the cost is saved. In addition, the amount of the gas used in the aftertreatment process is reduced, thereby reducing the damage to the patterned photoresist layer, decreasing the suspended particles generated by the attachments inside the cavity of the device, lowering the possibility of generating undesirable residues in the subsequent dry etching process of the substrate, and prolonging the period of daily maintenance of the device.

The above described is merely exemplary embodiments of the present invention, rather than limiting the protection scope of the present invention, and the protection scope of the present invention is determined by the appended claims.

The invention claimed is:

1. An aftertreatment method for a dry etching process of a pattern of a film layer comprising aluminum, the method comprising:
performing dechlorination treatment on a patterned film layer, comprising aluminum, of a substrate, and uninstalling the substrate from a bearing substrate simultaneously, wherein the patterned film layer is formed by a dry etching process using a gas comprising $Cl_2$;
wherein performing the dechlorination treatment comprises:
introducing a gas mixture comprising $O_2$ and $CF_4$ for the dechlorination treatment; wherein in the introduced gas mixture comprising $O_2$ and $CF_4$, a gas volume flow ratio of $O_2$ and $CF_4$ is 30:1; and
wherein uninstalling the substrate from the bearing substrate comprises:
loading a voltage of 6 kV to 15 kV to generate plasma to remove static electricity which adsorbs the bearing substrate.

2. The aftertreatment method according to claim 1, wherein in the introduced gas mixture comprising $O_2$ and $CF_4$, the gas volume flow of $O_2$ is 1500 sccm, and the gas volume flow of $CF_4$ is 50 sccm.

3. The aftertreatment method according to claim 1, wherein the duration of simultaneously performing the dechlorination treatment and the uninstalling of the bearing substrate ranges from 20 s to 50 s.

4. The aftertreatment method according to claim 1, wherein the cavity pressure for simultaneously performing the dechlorination treatment and the uninstalling of the bearing substrate ranges from 30 to 100 millitorrs.

5. A manufacturing method of a pattern of a film layer comprising aluminum, the method comprising:
taking a patterned photoresist layer which covers on a to-be-patterned film layer comprising aluminum, of a substrate, as a mask, and performing a dry etching process on the to-be-patterned film layer by using a gas comprising $Cl_2$ to form a patterned film layer of the substrate; and
performing dechlorination treatment on the patterned film layer of the substrate, and uninstalling the substrate from a bearing substrate simultaneously;
wherein performing the dechlorination treatment comprises:
introducing a gas mixture comprising $O_2$ and $CF_4$ for the dechlorination treatment; wherein in the introduced gas mixture comprising $O_2$ and $CF_4$, a gas volume flow ratio of $O_2$ and $CF_4$ is 30:1; and
wherein uninstalling the substrate from the bearing substrate comprises:
loading a voltage of 6 kV to 15 kV to generate plasma to remove static electricity which adsorbs the bearing substrate.

6. The manufacturing method according to claim 5, wherein the to-be-patterned film layer is a data signal line layer or a touch electrode line layer.

7. The manufacturing method according to claim 5, wherein the to-be-patterned film layer is a Ti/Al/Ti composite film layer, a Mo/Al/Mo composite film layer or a Ti/Al/Mo composite film layer.

8. The manufacturing method according to claim 5, wherein in the introduced gas mixture comprising $O_2$ and $CF_4$, the gas volume flow of $O_2$ is 1500 sccm, and the gas volume flow of $CF_4$ is 50 sccm.

9. The manufacturing method according to claim 5, wherein the duration of simultaneously performing the dechlorination treatment and the uninstalling of the bearing substrate ranges from 20 s to 50 s.

10. The manufacturing method according to claim 5, wherein the cavity pressure for simultaneously performing the dechlorination treatment and the uninstalling of the bearing substrate ranges from 30 to 100 millitorrs.

* * * * *